United States Patent [19]
Wada et al.

[11] Patent Number: 5,546,345
[45] Date of Patent: Aug. 13, 1996

[54] SEMICONDUCTOR MEMORY DEVICE HAVING BIPOLAR TRANSISTOR

[75] Inventors: Tomohisa Wada; Motomu Ukita, both of Hyogo, Japan

[73] Assignee: Mitsubishi Denki Kabushiki Kaisha, Tokyo, Japan

[21] Appl. No.: 460,941

[22] Filed: Jun. 5, 1995

[30] Foreign Application Priority Data

Nov. 24, 1994  [JP]  Japan .................................. 6-289347

[51] Int. Cl.⁶ .................................................. G11C 7/00
[52] U.S. Cl. .......................... 365/190; 365/177; 365/203; 257/370; 257/378
[58] Field of Search ...................... 365/177, 203, 365/154, 190; 257/370, 378, 557, 526, 577, 371

[56] References Cited

U.S. PATENT DOCUMENTS

| | | | |
|---|---|---|---|
| 5,392,243 | 2/1995 | Hakamura | 365/190 |
| 5,396,462 | 3/1995 | Kaneko | 365/190 X |
| 5,418,748 | 5/1995 | Monden | 365/190 X |
| 5,487,044 | 1/1996 | Kawaguchi et al. | 365/190 X |
| 5,495,120 | 2/1996 | Honda | 257/370 |

FOREIGN PATENT DOCUMENTS

| | | |
|---|---|---|
| 63-88856 | 4/1988 | Japan . |
| 63-278265 | 11/1988 | Japan . |
| 1-194461 | 8/1989 | Japan . |

OTHER PUBLICATIONS

Paul R. Gray and Robert G. Meyer, Analysis and Design of Analog Integrated Circuits, Second Edition, Chapters 2.3–2.4, pp. 88–113.

*Primary Examiner*—Do Hyun Yoo
*Attorney, Agent, or Firm*—Lowe, Price, LeBlanc & Becker

[57] ABSTRACT

In a memory cell array, memory cells are formed in a matrix. Bit lines are formed to be connected to prescribed memory cells. Emitters of bipolar transistors are connected to bit lines. Bipolar transistors have their bases connected to each other, and further to precharge signal control means. Collector regions of bipolar transistors are connected to a power supply node. Bipolar transistors have a base region formed by introducing a p type impurity to the entire main surface of the semiconductor substrate, and n type impurity concentration included in the collector region immediately below the base region is at most $5\times10^{18}$ cm$^{-1}$. Consequently, a semiconductor memory device having a bipolar transistor which is capable of high speed operation and having high reliability can be manufactured at low cost.

12 Claims, 12 Drawing Sheets

SEMICONDUCTOR MEMORY DEVICE HAVING BIPOLAR TRANSISTOR

BACKGROUND OF THE INVENTION

1. Field of the Invention

The present invention relates to a semiconductor memory device having a bipolar transistor and, more specifically, to a semiconductor memory device having a bipolar transistor which can be manufactured at low cost without impeding high speed of operation.

2. Description of the Background Art

Figure 10:
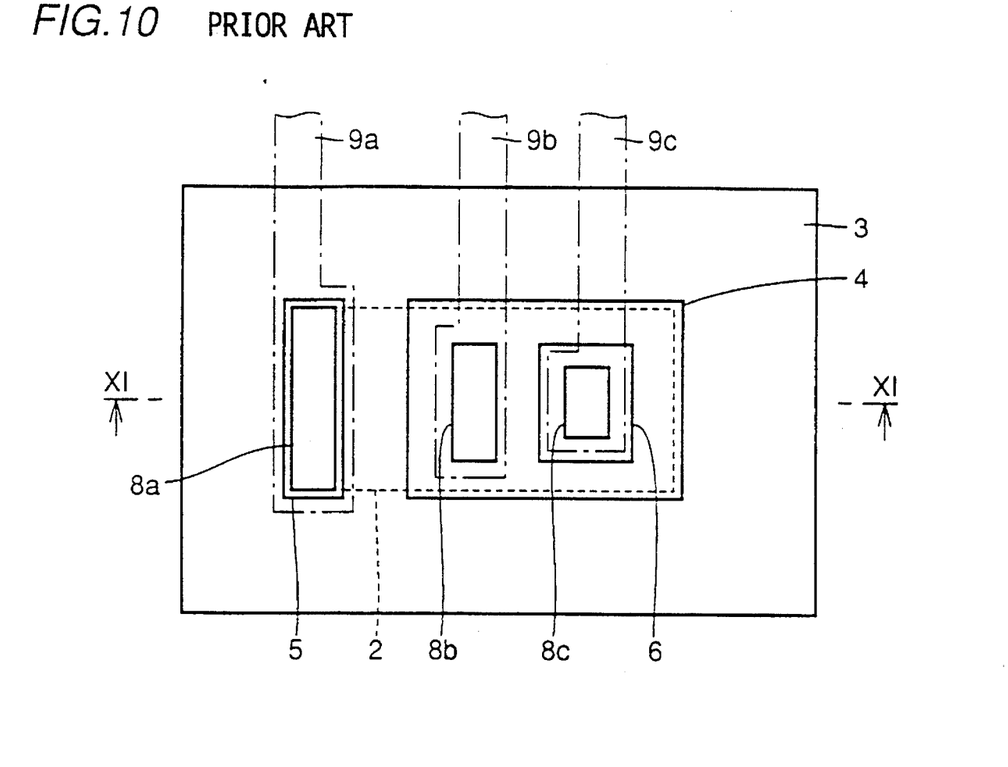
FIG. 10 is a plan view showing an example of a conventional bipolar transistor.
Figure 11:
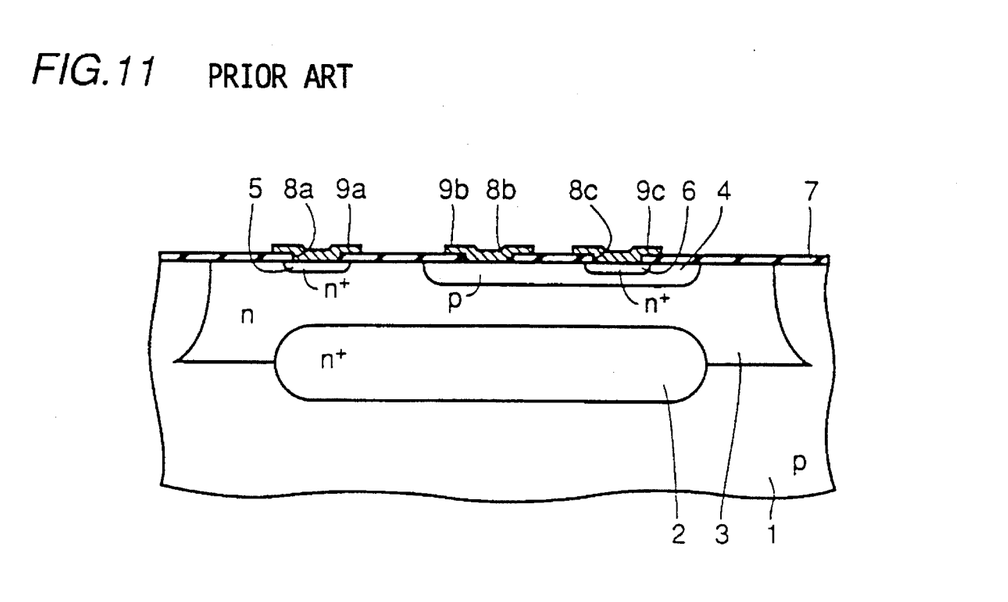
FIG. 11 is a cross section taken along the line XI—XI of FIG. 10.

A bipolar transistor has been conventionally used in various devices. FIGS. 10 and 11 show a bipolar transistor which has been generally used. FIG. 10 is a plan view of a conventional bipolar transistor. FIG. 11 is a cross section taken along the line XI—XI of FIG. 10. Structure and method of manufacturing the bipolar transistor having such structure are described in detail in Paul R. Gray and Robert G. Meyer, *Analysis and Design of Analog Integrated Circuits*, Second Edition, Chapters 2.3–2.4, for example.

The structure of the conventional bipolar transistor will be described with reference to FIGS. 10 and 11. Referring to FIGS. 10 and 11, an n type buried diffusion layer 2 having an n type impurity at a high concentration is formed at the main surface of a p type semiconductor substrate 1. On the n type buried diffusion layer 2, an n type epitaxial layer 3 is formed. The n type epitaxial layer 3 is formed by epitaxial growth, and includes an n type impurity at low concentration. A p type base region 4 is formed on the surface of n type epitaxial layer. An n type emitter region 6 is formed on the surface of p type base region 4. An insulating layer 7 is formed to cover the surface of n type epitaxial layer 3, and openings 8a, 8b and 8c are formed at prescribed positions of insulating layer 7. A collector electrode 9a is formed in opening 8a, a base electrode 9b is formed in opening 8b, and an emitter electrode 9c is formed in opening 8c. Collector electrode 9a, base electrode 9b and emitter electrode 9c are preferably formed of a metal including Al. On the surface of n type epitaxial layer 3 which is in contact with collector electrode 9a, an n$^+$ diffusion layer 5 having an n type impurity at high concentration is formed.

Figure 12:
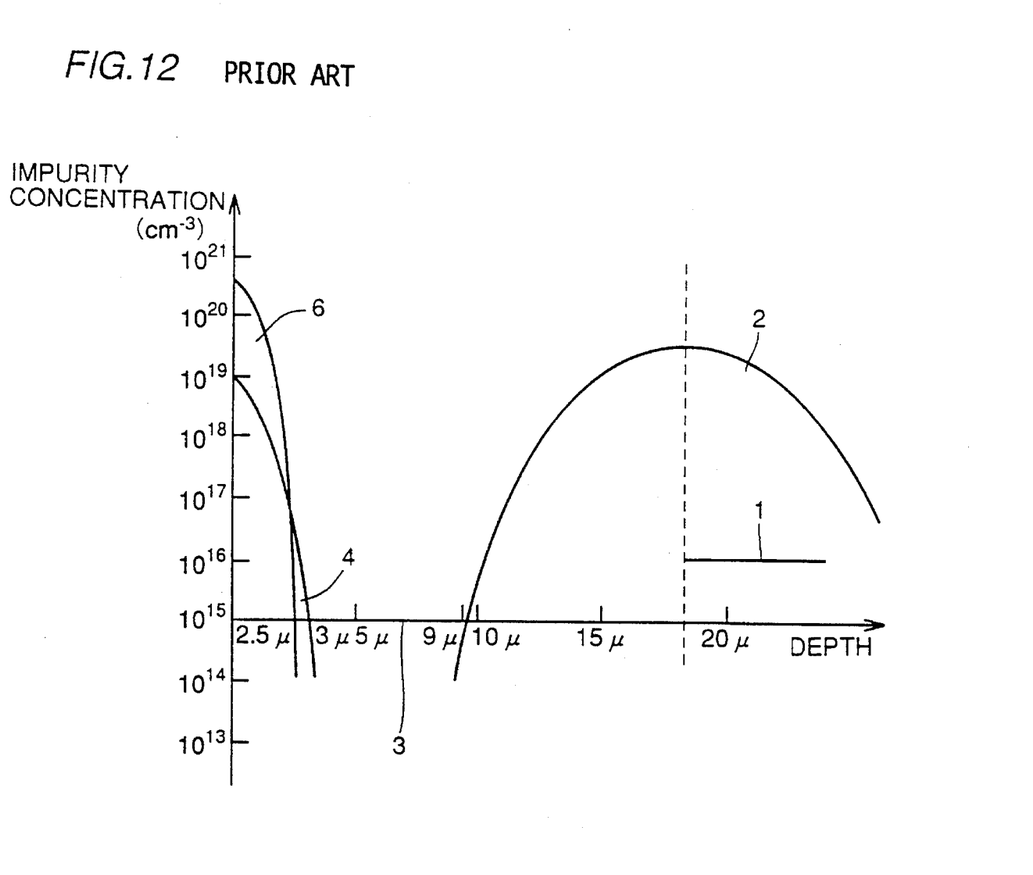
FIG. 12 shows impurity profile in the depth direction of the substrate of the bipolar transistor shown in FIGS. 10 and 11.

Concentration profile of the impurity in the depth direction of the semiconductor substrate in the conventional bipolar transistor having such structure as described above is as shown in FIG. 12. Referring to FIG. 12, below n type emitter region 6, p type base region 4 is formed, and below the p type base region 4, n type epitaxial layer 3 including the n type impurity of about $1 \times 10^{15}$ cm$^{-3}$ is formed. Below n type epitaxial 3, n type buried diffusion layer 2 including n type impurity of high concentration is formed. In the conventional bipolar transistor of the type as described above, Collector resistance is reduced as it has n type buried diffusion layer 2, and breakdown voltage between the collector/emitter can be maintained. Therefore, a bipolar transistor with high performance can be obtained. However, in the bipolar transistor of the type described above, epitaxial growth of the substrate is necessary. This results in significant increase in manufacturing cost.

Figure 13:
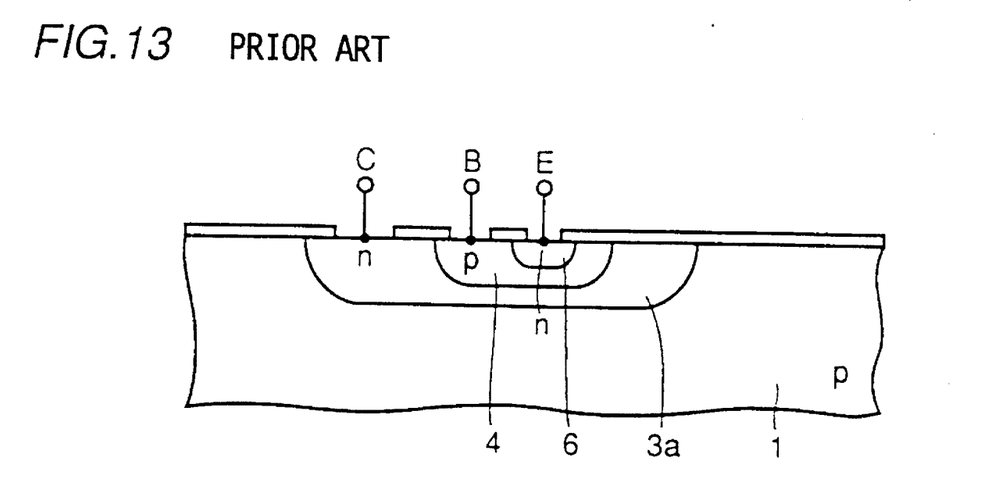
FIG. 13 is a cross section showing another example of the conventional bipolar transistor.

Another example of the conventional bipolar transistor is of the type shown in FIG. 13. FIG. 13 is a cross section showing another type of the conventional bipolar transistor. The bipolar transistor of the type shown in FIG. 13 includes an n type collector region 3a, a p type base region 4 and an n type emitter region 6. The bipolar transistor of this type is formed by diffusing impurity from the surface of p type semiconductor substrate 1. Therefore, as compared with the bipolar transistor shown in FIGS. 10 and 11, manufacturing cost can be reduced.

Figure 14:
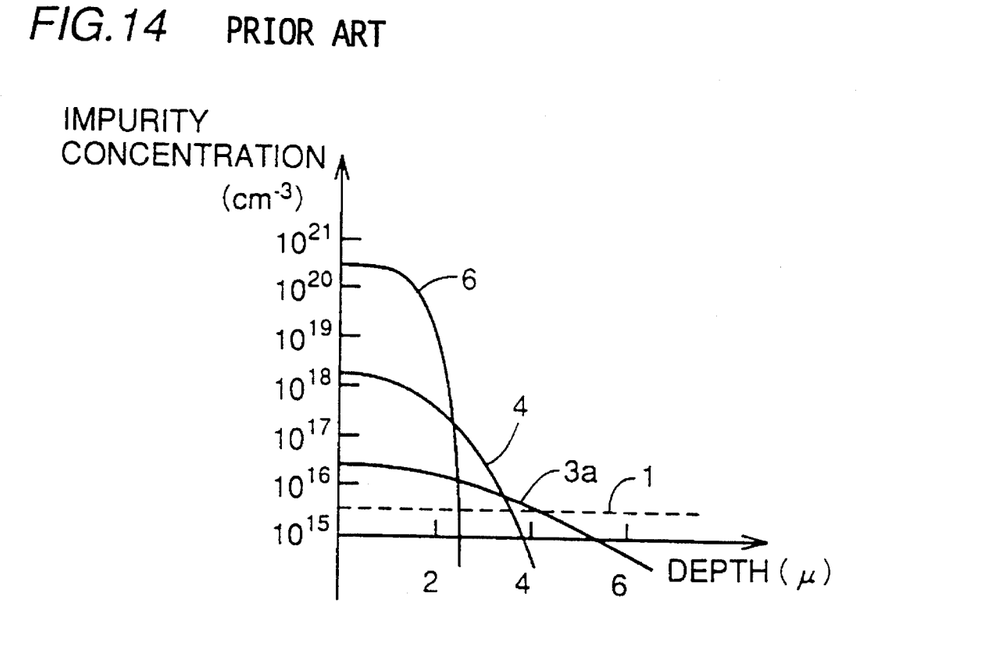
FIG. 14 shows impurity profile in the depth direction of the substrate of the bipolar transistor shown in FIG. 13.

However, the bipolar transistor of the type shown in FIG. 13 has the following disadvantages. The disadvantages will be described with reference to FIG. 14. FIG. 14 shows concentration profile of the impurity in the depth direction of p type semiconductor substrate 1 in the bipolar transistor of the type shown in FIG. 13.

Referring to FIG. 14, the n type impurity concentration included in n type collector region 3a is low at a portion deep in the substrate. This results in increased collector resistance. As the collector resistance increases, there is greater voltage drop when current flows in the collector region. Therefore, it is possible that the base/collector is strongly biased in the forward direction. If the forward direction bias is 400 mV or more, the bipolar transistor is saturated, and the speed of operation is significantly reduced.

Further, the bipolar transistor of the type shown in FIG. 13 also has the disadvantage that the breakdown voltage between collector/emitter is reduced.

SUMMARY OF THE INVENTION

The present invention was made to solve the above described problems. An object of the present invention is to provide a semiconductor memory device having a bipolar transistor which can be manufactured at low cost without impeding high speed operation and high reliability.

The semiconductor memory device having a bipolar transistor in accordance with the present invention includes, according to one aspect, a semiconductor substrate of a first conductivity type having a main surface, a memory cell, a bit line, a bipolar transistor, and precharge signal control unit. The memory cell is formed on the main surface of the semiconductor substrate. The bit line is formed on the main surface of the semiconductor substrate and electrically connected to the memory cell. The bipolar transistor is electrically connected to the bit line. The bipolar transistor includes a collector region of the second conductivity type which includes an upper region having an impurity of the second conductivity type at relatively low concentration formed at the main surface of the semiconductor substrate and a lower region having the impurity of the second conductivity type at relatively high concentration, a base region of the first conductivity type formed at the upper region of the collector region by introducing an impurity of the first conductivity type to the entire main surface of the semiconductor substrate, and an emitter region of the second conductivity type formed on the surface of the base region. Further, impurity concentration of the second conductivity type included in the collector region immediately below the base region of the bipolar transistor is at most $5 \times 10^{18}$ cm$^{-3}$ and it is used for precharging the aforementioned bit line. The precharge signal control unit is connected to the base region and controls a precharge signal which is applied to the base region for precharging the bit line.

As described above, according to one aspect, in the semiconductor memory device having a bipolar transistor of the present invention, the base region of the bipolar transistor is formed by introducing an impurity of the first conductivity type entirely to the main surface of the semiconductor substrate. In other words, the base region is formed without a mask. Therefore, the steps for forming the mask can be omitted, and manufacturing cost can be reduced. Further, the concentration of the collector region immediately below the base region is at most $5\times10^{18}$ cm$^{-1}$. In other words, high concentration buried diffusion layer is not formed below the base region. Accordingly, formation of the buried diffusion layer can be omitted, and manufacturing cost can further be reduced. As the buried diffusion layer is omitted, collector resistance increases to some extent. However, as the collector region has a lower region including relatively high concentration impurity of the second conductivity type, the increase in collector resistance can be suppressed. Since the increase in collector resistance can be suppressed and since precharge signal control unit is provided, the bipolar transistor can be used without the possibility of saturation. Further, since the base region and the emitter region are formed in the upper region which includes the impurity of the second conductivity type of relatively low concentration, decrease in breakdown voltage between the collector/emitter can be prevented.

According to another aspect, the semiconductor memory device having a bipolar transistor of the present invention includes a semiconductor substrate of a first conductivity type having a main surface, a plurality of memory cells, first and second bit lines, first and second bipolar transistors and first and second current sources. The plurality of memory cells are formed on the main surface of the semiconductor substrate. The first and second bit lines are formed on the main surface of the semiconductor substrate and electrically connected to prescribed memory cells. The first and second bipolar transistors are electrically connected to the first and second bit lines through first and second switching MOS transistors. The first and second bipolar transistors share a collector region of a second conductivity type having an upper region including an impurity of the second conductivity type of relatively low concentration formed in the main surface of the semiconductor substrate and a lower region including an impurity of the second conductivity type of relatively high concentration. The first and second bipolar transistors include first and second base regions of the first conductivity type formed in the surface of the collector region by introducing an impurity of the first conductivity type entirely to the main surface of the semiconductor substrate, and first and second emitter regions of the second conductivity type formed in the surface of the first and second base regions, respectively. The impurity concentration of the second conductivity type included in the collector region immediately below the first and second base regions is at most $5\times10^{18}$ cm$^{-3}$. Further, the first and second bipolar transistors are used for shifting the potential level of the first bit line and the potential level of the second bit line between a first potential level and a second potential level which is lower than the first potential level. The first and second current sources are connected to the first and second emitter regions respectively, for drawing out current from the emitters of the first and second bipolar transistors.

According to this aspect of the semiconductor memory device having a bipolar transistor of the present invention, similar to the first aspect mentioned above, the manufacturing cost can be reduced and decrease in breakdown voltage between collector/emitter can be effectively prevented. In this aspect also, since the collector region has a lower region, increase in collector resistance can be suppressed as in the first aspect. Further, according to this aspect, first and second current sources are connected to the first and second emitter regions, respectively. By optimizing the current value of the current sources, saturation of the first and second bipolar transistors can be effectively prevented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the present invention applied to an SRAM (Static Random Access Memory) will be described with reference to FIGS. 1 to 9.

Figure 1:
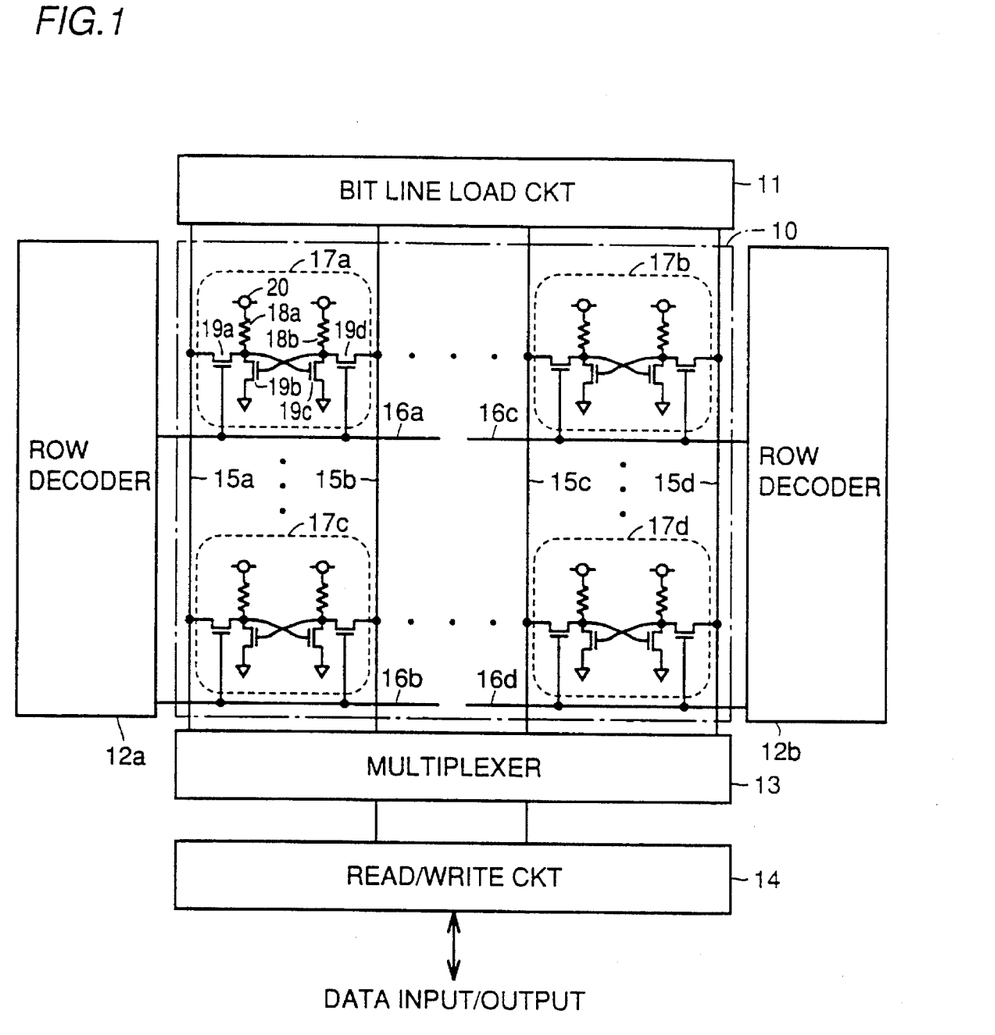
FIG. 1 is a block diagram showing a schematic structure of a semiconductor memory device in accordance with one embodiment of the present invention.
Figure 2:
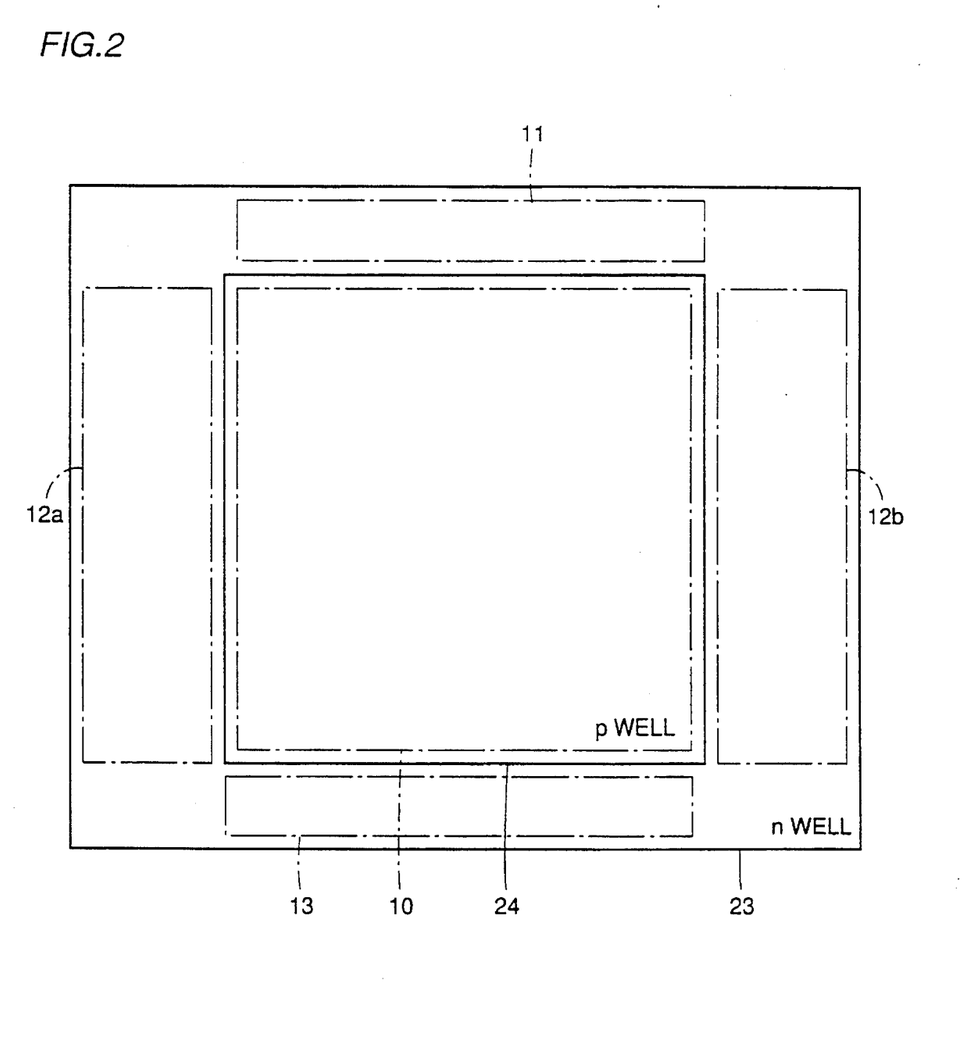
FIG. 2 is a plan view schematically showing a well structure of the semiconductor memory device shown in FIG. 1.

FIG. 1 is a block diagram showing a schematic structure of the SRAM in accordance with one embodiment of the present invention. FIG. 2 is a plan view schematically showing the well structure of the SRAM shown in FIG. 1.

Referring to FIG. 1, the schematic structure of the SRAM in the present embodiment will be described. Referring to FIG. 1, memory cells 17a, 17b, 17c and 17d are arranged in a matrix, in a memory cell array 10. Each of the memory cells 17a, 17b, 17c and 17d has nMOS transistors 19a, 19b, 19c and 19d as well as load elements 18a and 18b.

Meanwhile, a plurality of bit lines 15a, 15b, 15c and 15d are formed extending over memory cell array 10. Word lines 16a, 16b, 16c and 16d are formed extending in a direction crossing the bit lines 15a to 15d. Bit lines 15a to 15d are electrically connected to memory cells 17a to 17d, through nMOS transistors 19a and 19d.

Each of the bit lines 15a to 15d is connected to a bit line load circuit 11 and a multiplexer 13. Word lines 16a and 16b are connected to row decoder 12a, while word lines 16c and 16d are connected to a row decoder 12b.

Word lines 16a to 16d select one row of the memory cell array, and in reading operation, transmit data stored in memory cells 17a to 17d to bit lines 15a to 15d. The data which has been transmitted to bit lines 15a to 15d is selected by multiplexer 13, and transferred to a sense amplifier portion of a read/write circuit 14. In data writing, write data is transmitted from a write driver of read/write circuit 14 through multiplexer 13 to bit lines 15a to 15d. Consequently, data is written to the selected memory cell 17a to 17d.

Referring to FIG. 2, memory cell array 10 is formed in a p well region 24, and an n well region 23 is formed surrounding p well region 24. In n well region 23, bit line load circuit 11, row decoders 12a and 12b, and multiplexer 13 are formed.

By forming an n well region 23 surrounding memory cell array 10, it becomes possible to effectively prevent introduction of minority carriers generated around n well region 23 into p well region 24 (memory cell array 10). Therefore, destruction of data stored in memory cells 17a to 17d caused by introduction of carriers in p well region 24 can be effectively prevented. Thus reliability of the semiconductor memory device can be improved.

The concept of forming an n well region 23 surrounding a p well region 24 in which memory cell array 10 is formed is applicable not only to an SRAM such as in the present embodiment but also to other semiconductor memory devices.

Figure 3:
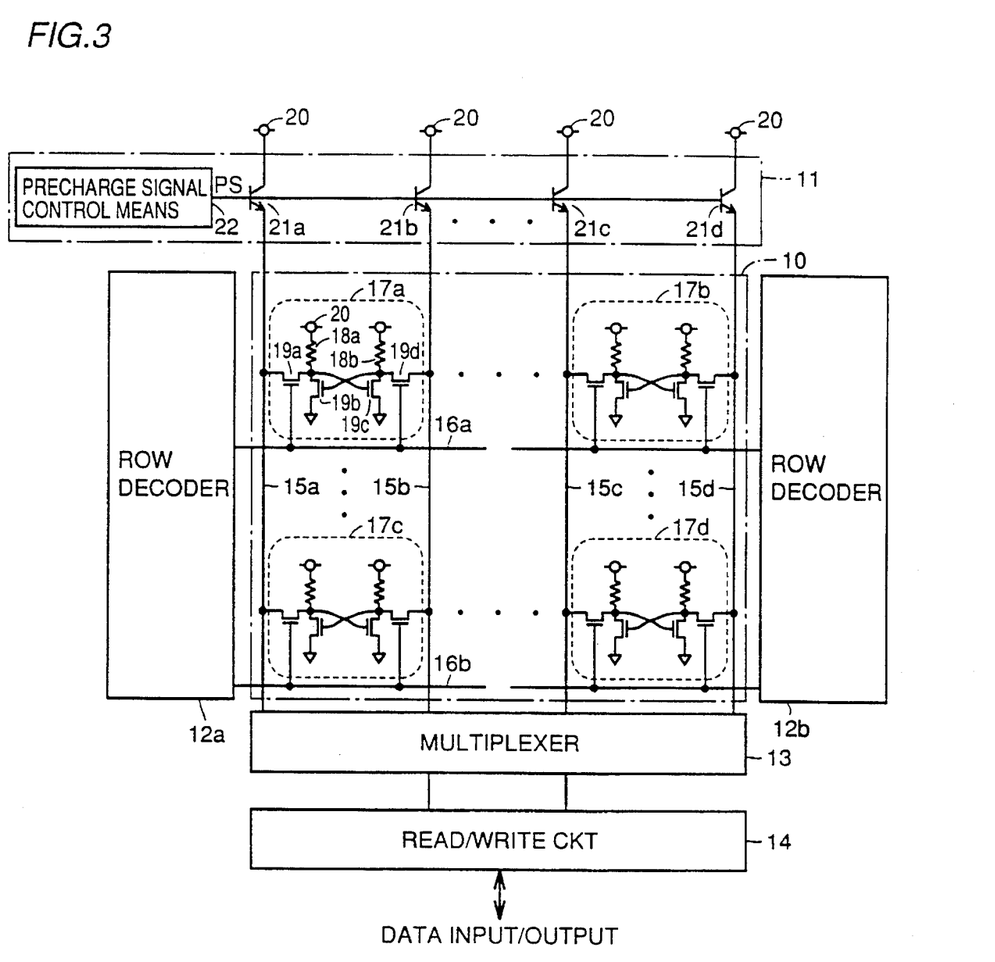
FIG. 3 shows a bit line precharge circuit of the semiconductor memory device in accordance with one embodiment of the present invention.

The structure of the SRAM of the present embodiment will be described in greater detail with reference to FIGS. 3 to 9. FIG. 3 shows a bit line precharge circuit included in bit line load circuit 11, for precharging bit lines 15a to 15d.

The bit line precharge circuit includes precharge signal (PS) generating means (not shown), bipolar transistors 21a, 21b, 21c and 21d, and precharge signal control means 22 for controlling the precharge signal. Collectors of bipolar transistors 21a to 21d are connected to a power supply node 20 which receives a power supply potential. The bases of bipolar transistors 21a to 21d are common and connected to precharge signal control means 22. Precharge signal control means 22 allows slight lowering of the high level of the precharge signal from the power supply potential, and optimization of the time constant of the rising waveform of the precharge signal. Therefore, saturation of bipolar transistors 21a to 21d can be prevented. This prevents degradation in high speed operation of bipolar transistors 21a to 21d. Bipolar transistors 21a to 21d have their emitters connected to bit lines 15a to 15d, respectively.

Figure 4:
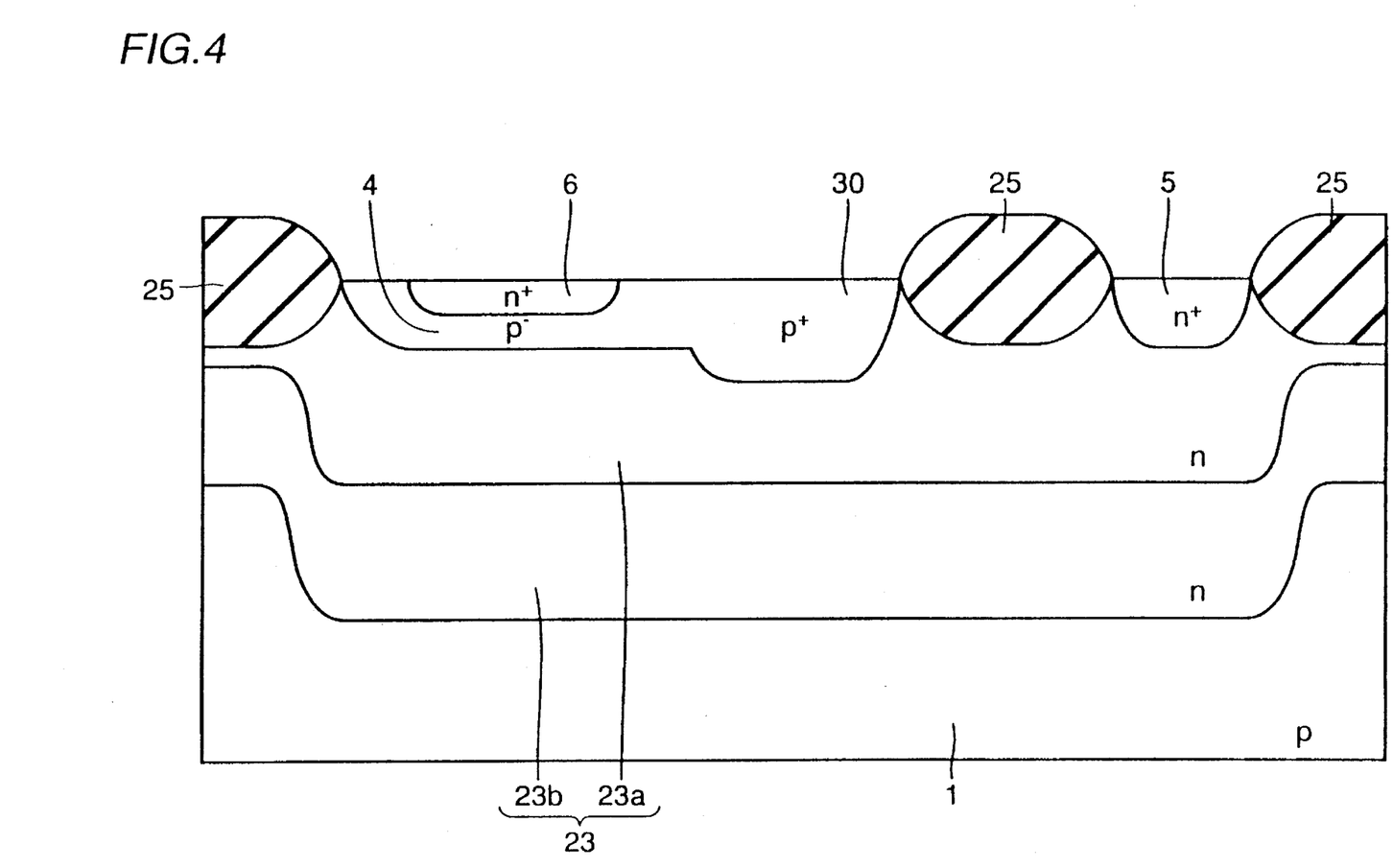
FIG. 4 is a cross section showing a bipolar transistor used in the present invention.

The structure of the bipolar transistor used in the present invention will be described in greater detail with reference to FIG. 4. FIG. 4 is a cross section showing the bipolar transistor used in the present invention.

Referring to FIG. 4, the bipolar transistor of the present invention is formed at a main surface of p type semiconductor substrate 1, and it includes an n well region 23 serving as the collector, a p type base region 4 and an n type emitter region 6.

The n well region 23 includes an n well upper region 23a and an n well lower region 23b. The n type impurity concentration included in n well upper region 23a is set lower than that of n well lower region 23b. As a result, the impurity concentration peak of the second conductivity type included in n well region 23 is positioned deeper in the p type semiconductor substrate 1 than the junction between p type base region 4 and n well region 23. However, n type impurity concentration included in n well lower region 23b is at most $5 \times 10^{18}$ cm$^{-3}$. The n well region 23 can be formed by introducing an n type impurity to the main surface of p type semiconductor substrate 1 with high energy. As there is provided an n well lower region 23b at relatively high concentration as described above, increase in collector resistance can be suppressed to higher extent than the example shown in FIG. 13.

Meanwhile, n type emitter region 6 and p type base region 4 are formed in n well upper region 23a which includes n type impurity of relatively low concentration. Therefore, decrease in breakdown voltage between collector/emitter can also be effectively prevented. Further, in the bipolar transistor shown in FIG. 4, p type base region 4 is formed by introducing a p type impurity to the entire main surface of p type semiconductor substrate 1, without forming a mask layer such as a resist on the main surface of p type semiconductor substrate. Therefore, even in n$^+$ type diffusion layer 5 of high concentration, p type impurity having approximately the same concentration as that of p type impurity in the p type base region 4 is included. This also applies to other n type impurity diffusion layers formed at the main surface of p type semiconductor substrate 1 at the time of forming p type base region 4. Since p type base region 4 can be formed without forming a mask layer, the manufacturing cost of the bipolar transistor can be reduced. Further, referring to FIG. 4, there is not an n$^+$ buried diffusion layer, which also reduces the manufacturing cost.

The collector resistance of bipolar transistor having the above described structure is relatively high, though not so high as in the example of FIG. 13. Therefore, saturation of bipolar transistor is likely. However, even such a bipolar transistor can be used while maintaining high speed of operation, by some developments in the method of use. In the example shown in FIG. 3, the aforementioned precharge signal control means 22 is provided so as to effectively prevent saturation of bipolar transistors 21a to 21d. Accordingly, the bipolar transistor manufactured at low cost can be used in an SRAM while maintaining high speed of operation.

Figure 5:
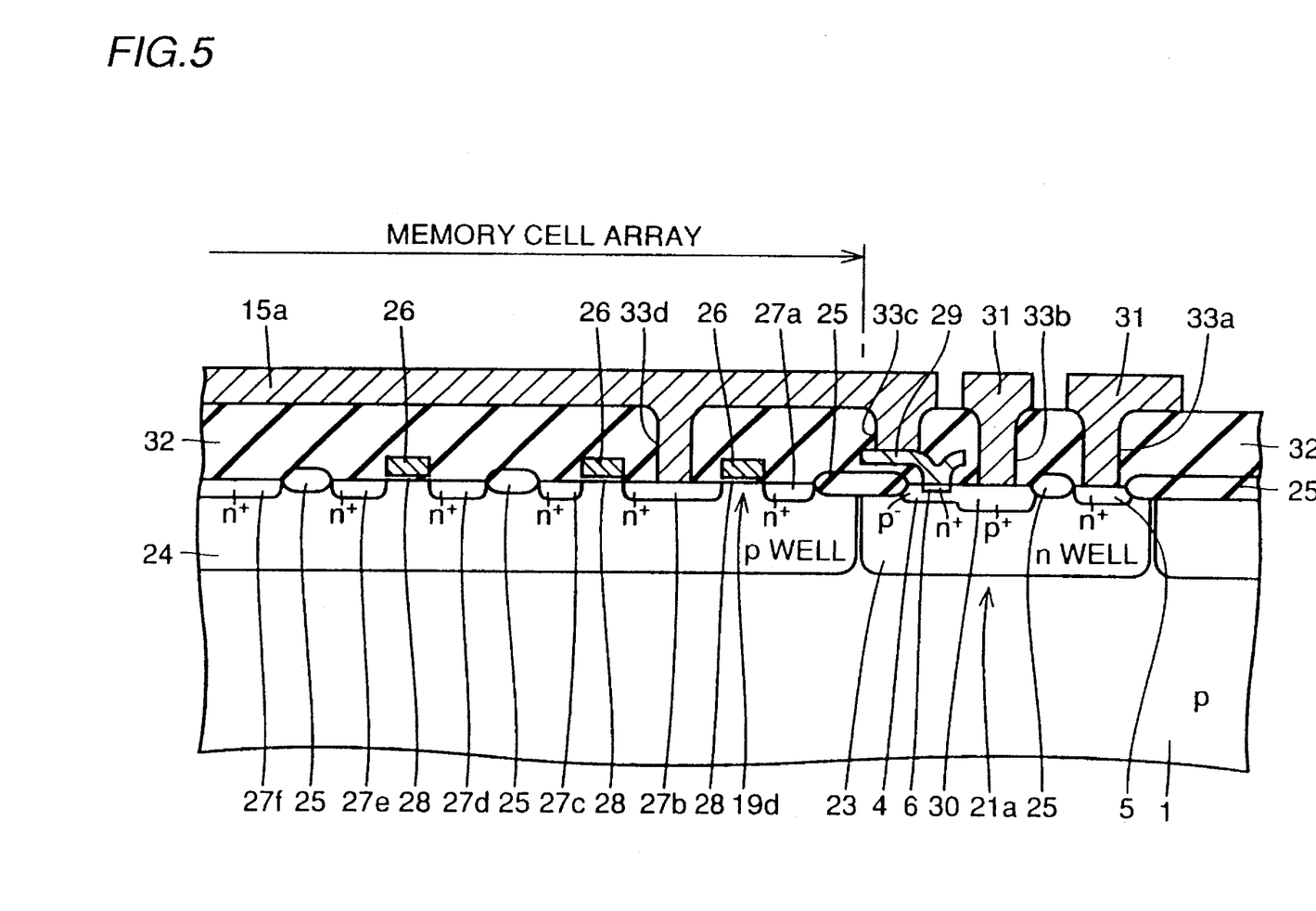
FIG. 5 is a cross section showing in enlargement portions near the bipolar transistor shown in FIG. 3.

Cross sectional structure near the bipolar transistor 21a shown in FIG. 3 will be described with reference to FIG. 5. FIG. 5 is a cross section showing portions near the bipolar transistor 21a of FIG. 3.

Referring to FIG. 5, at the main surface of p type semiconductor substrate 1, an n well region 23 is formed adjacent to a p well region 24. The n well region 23 functions as a collector of bipolar transistor 21a. The n well region 23 is connected to a power supply node, and to which a power supply potential is applied. Therefore, introduction of minority carriers generated around n well region 23 into p well region 24 can be effectively prevented. Thus destruction of data stored in the memory cells caused by introduction of minority carriers into p well region 24 can be effectively prevented, thus improving reliability of the SRAM.

In the surface of n well region 23, p type base region 4, a p$^+$ region 30 continuous to p type base region 4, an n type emitter region 6 formed at the surface of p type base region 4 and an n$^+$ diffusion layer 5 are formed. At the surface of p well region, n$^+$ impurity diffusion layers 27a, 27b, 27c, 27d, 27e and 27f are formed selectively.

At the main surface of p type semiconductor substrate 1, an isolating oxide film 25 is formed selectively. At prescribed positions on the surface of p well region 24, a gate electrode 26 is formed with a gate insulating layer 28 interposed. An interconnection layer 29 of, for example, polycrystalline silicon is formed on the surface of emitter region 6. An interlayer insulating layer 32 is formed to cover entirely the main surface of p type semiconductor substrate 1. Contact holes 33a, 33b, 33c and 33d are formed at prescribed positions of interlayer insulating layer 32. A metal interconnection 31 is formed in contact hole 33a to be electrically connected to n+ impurity diffusion layer 5. Metal interconnection 31 is formed in contact hole 33b so as to be electrically connected to p+ region 30. Bit line 15a of metal, for example, is formed in contact holes 33c and 33d.

Figure 6:
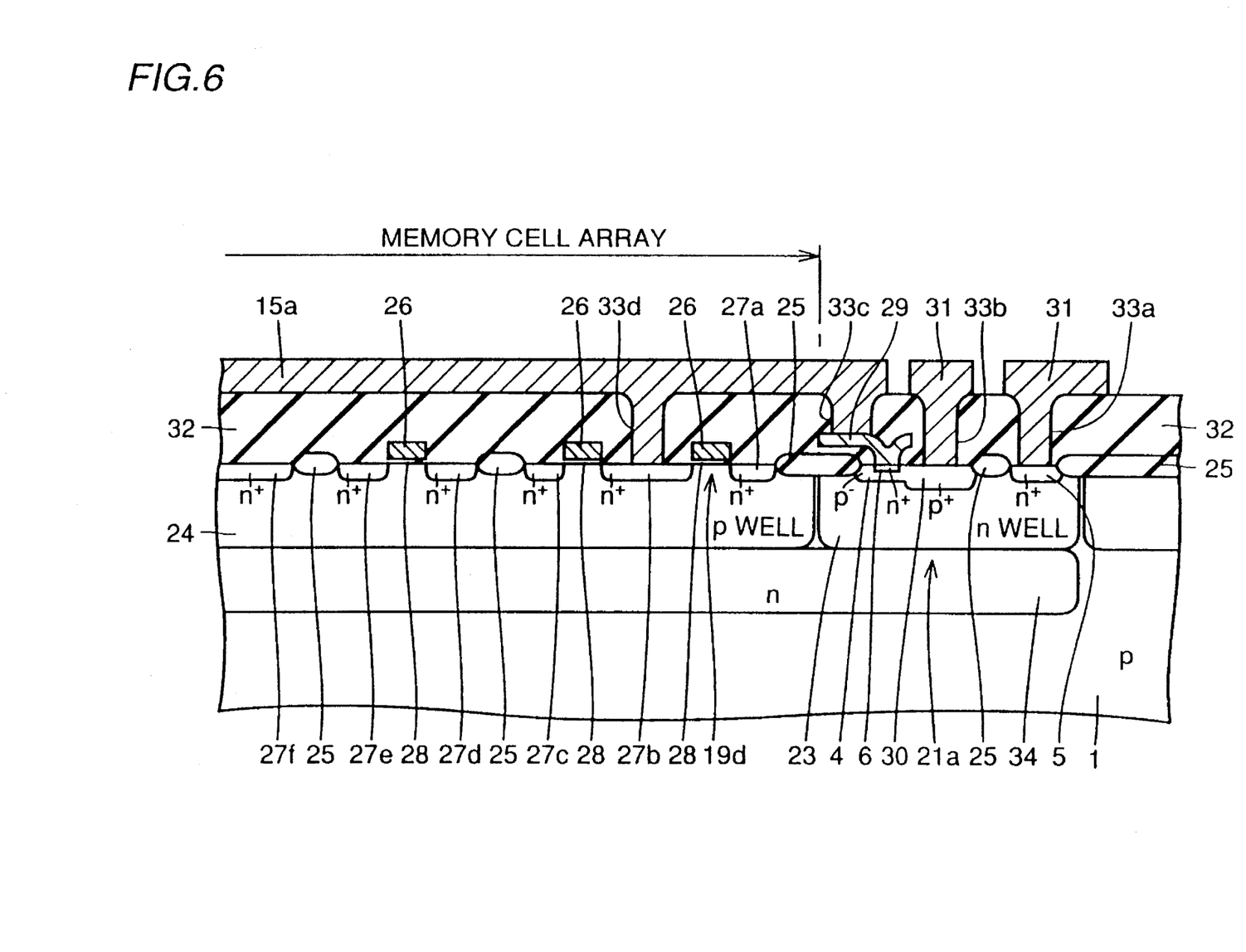
FIG. 6 is a cross section showing a modification of the cross sectional structure shown in FIG. 5.

A modification of the semiconductor memory device in accordance with the embodiment of FIG. 5 will be described with reference to FIG. 6. FIG. 6 is a cross section showing, in enlargement, portions near the bipolar transistor 21a of the modification.

Referring to FIG. 6, in this embodiment, an n type buried diffusion layer 34 is formed in contact with the lower surface of n well region 23 and extending below p well region 24. The n type buried diffusion layer 34 is formed below the entire lower surface of p well region 24. Therefore it becomes possible to perfectly isolate p well region 24 from p type semiconductor substrate 1, by n type buried diffusion layer 34 and n well region 23. Accordingly, introduction of carriers generated around n well region 23 into p well region 24 can be perfectly prevented. Thus reliability of the semiconductor memory device can further be improved than in the example of FIG. 5. Except this point, the structure is the same as that of FIG. 5. The buried diffusion layer 34 can be formed by introducing n type impurity with high energy.

Figure 7:
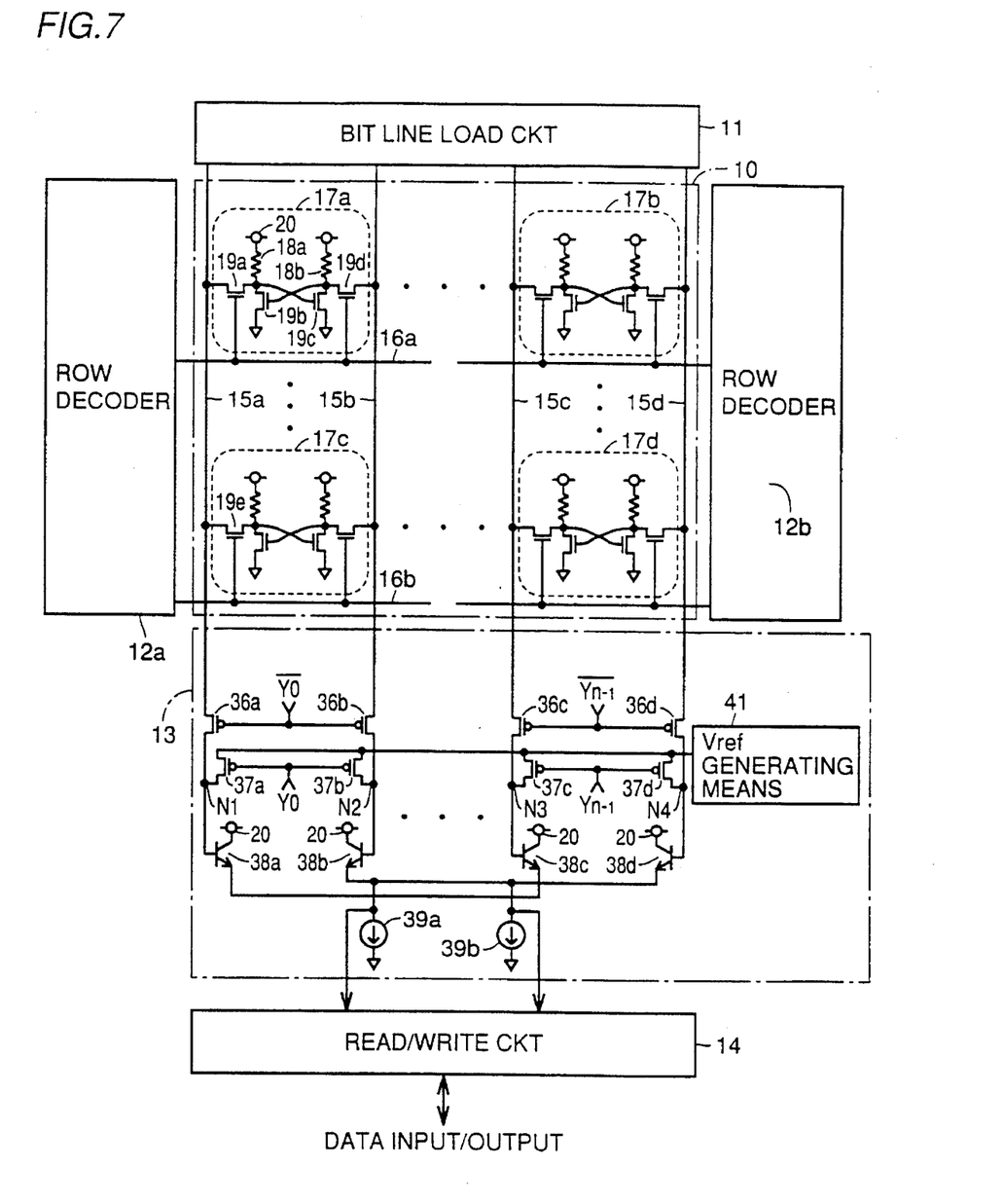
FIG. 7 shows a level shift circuit of the semiconductor memory device in accordance with one embodiment of the present invention.

An example in which multiplexer 13 is provided with level shift function will be described with reference to FIG. 7. FIG. 7 is a block diagram showing a schematic structure of an SRAM in which multiplexer 13 has level shift function.

Referring to FIG. 7, bit lines 15a to 15d are connected to base regions of bipolar transistors 38a, 38b, 38c and 38d through pMOS transistors 36a to 36d. Bipolar transistors 38a to 38d have their collector regions connected to a power supply node 20. Bipolar transistors 38a and 38c have their emitter regions connected to a current source 39a. Bipolar transistors 38b and 38d have their emitter regions connected to a current source 39b.

At nodes N1, N2, N3 and N4 between pMOS transistors 36a to 36d and base regions of bipolar transistors 38a to 38d, Vref generating means 41 for generating a potential (Vref) sufficiently lower than the potential for precharging the bit line is connected through pMOS transistors 37a, 37b, 37c and 37d.

The pMOS transistors 37a and 37b receive at their gates a signal YO, and pMOS transistors 36a and 36b receive at their gates an inverted signal/YO of the signal YO. The pMOS transistors 37c and 37d receive at their gates a signal Yn-1, and pMOS transistors 36c and 36d receive at their gates an inverted signal/Yn-1 of the signal Yn-1. This structure allows selection of a pair of bit lines.

The signal on the bit line selected in this manner is transmitted to bipolar transistors 38a to 38d. At this time, the potential Vref which is sufficiently lower than the precharge potential of the bit lines is applied to the non-selected bit lines, by Vref generating means 41. Namely, the aforementioned Vref is applied to the bases of bipolar transistors 38a to 38d connected to the non-selected bit lines. Accordingly, the bipolar transistors connected to the non-selected bit lines are turned off. As a result, the signal on the selected bit line has its level shifted by bipolar transistors 38a to 38d and provided as an output.

As described above, when bipolar transistors 38a to 38d are used in the level shift circuit, saturation of bipolar transistors 38a to 38d can be effectively prevented by setting the high level of bit lines 15a to 15d lower than the power supply potential, or by optimizing current value of current sources 39a and 39b. Therefore, high speed of operation of bipolar transistors 38a to 38d can be effectively maintained.

Figure 8:
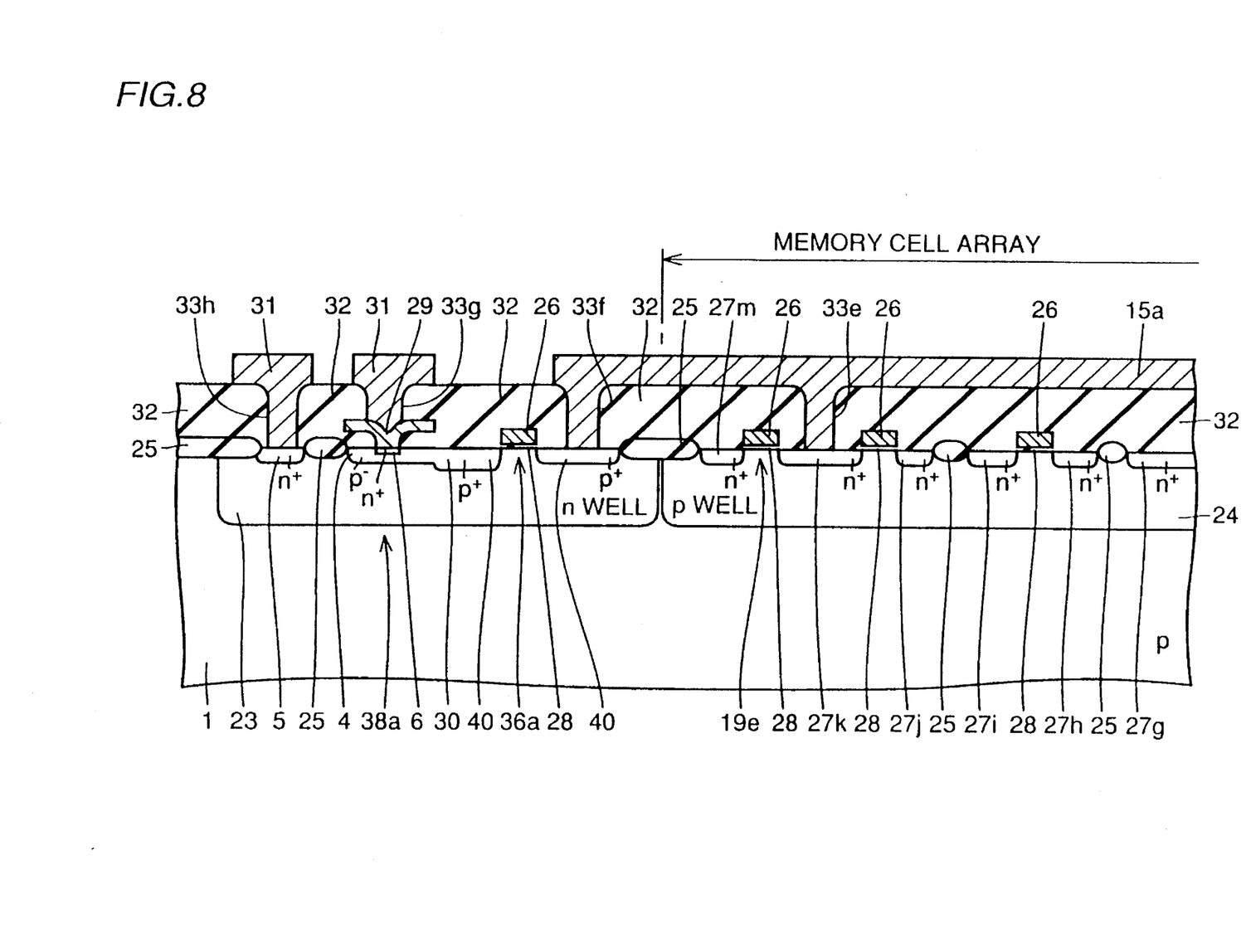
FIG. 8 is a cross section showing, in enlargement, portions near the bipolar transistor of FIG. 7.

Structure near the bipolar transistor 38a of FIG. 7 will be described in greater detail with reference to FIG. 8. FIG. 8 is a cross section showing, in enlargement, portions near the bipolar transistor 38a of FIG. 7.

Referring to FIG. 8, as in the example of FIG. 5, an n well region 23 is formed adjacent to p well region 24. The effect obtained by this structure is the same as that of FIG. 6. In the example of FIG. 8, the p+ region 30 of bipolar transistor 38a and one of the source/drain regions of pMOS transistor 36a provided adjacent to the bipolar transistor 38a are common. In other words, the source/drain region 40 of pMOS transistor 36a also serves as the p+ region 30 of bipolar transistor 38a.

Except this point, the structure is similar to that of FIG. 6, and in the surface of p well region 24, n type impurity diffused layers 27g, 27h, 27i, 27j, 27k, 27l and 27m as well as an interlayer insulating layer 32 are formed. Contact holes 33e, 33f, 33g and 33h are formed at prescribed positions of interlayer insulating layer 32.

Figure 9:
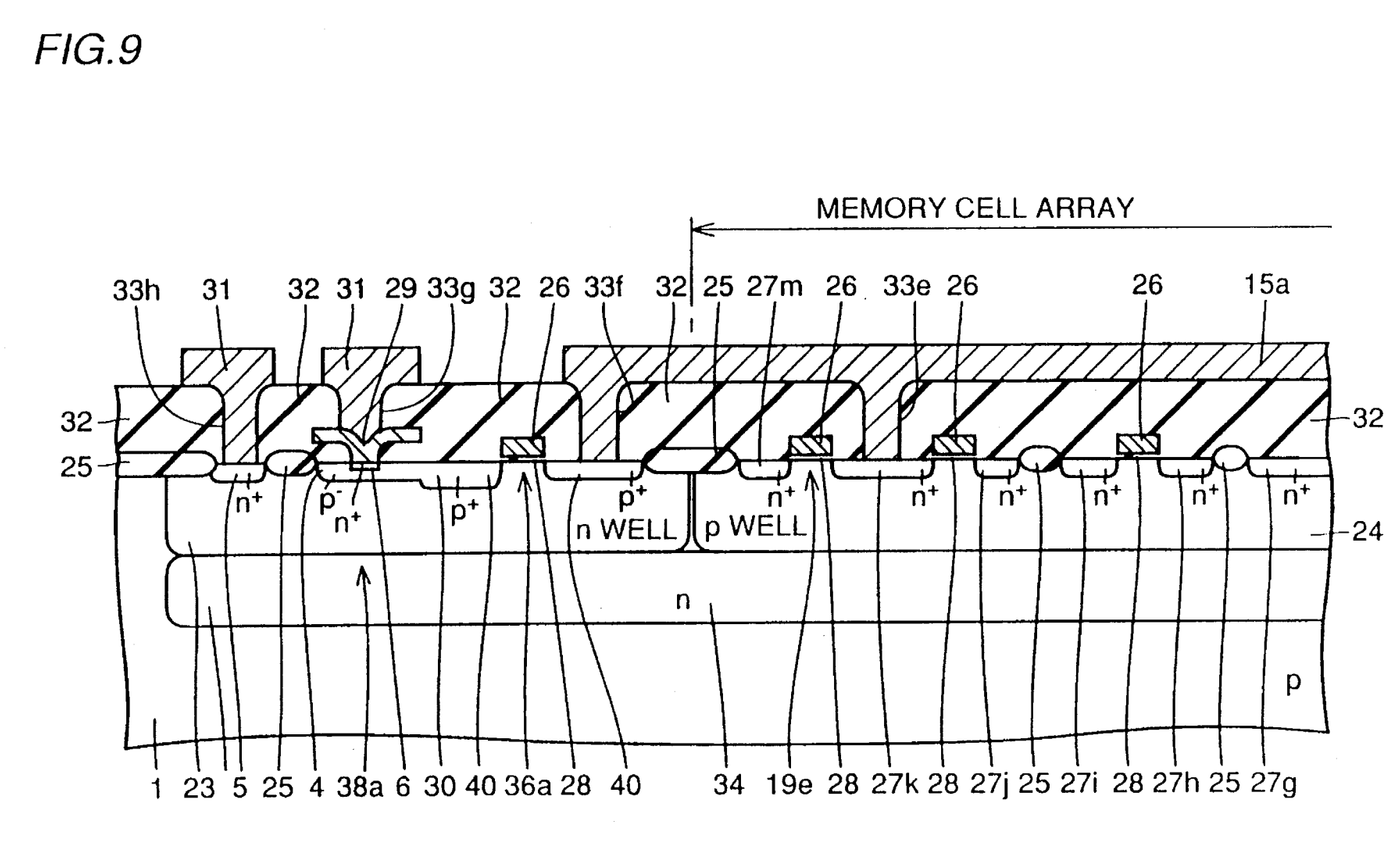
FIG. 9 is a cross section showing a modification of the cross sectional structure shown in FIG. 8.

A modification of the structure shown in FIG. 8 will be described with reference to FIG. 9. FIG. 9 is a cross section showing a modification of the structure shown in FIG. 8. Referring to FIG. 9, it is similar to FIG. 8 except that an n type buried diffusion layer 34 is formed. The effect provided by this n type buried diffusion layer 34 is the same as that of FIG. 6.

As described above, according to the present invention, a bipolar transistor manufactured at low cost can be used without saturation. Therefore, high speed operation of the bipolar transistor can be maintained. Further, when a well region is formed surrounding a memory cell array and part of the well region is used as a collector region of a bipolar transistor, introduction of minority carriers from the surroundings of the well region into the memory cell array can be effectively prevented. Therefore, destruction of data in the memory cell can be prevented and reliability of the semiconductor memory device can be improved.

As described above, by the present invention, a semiconductor memory device having a bipolar transistor capable of high speed operation and having high reliability can be manufactured at low cost.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having a bipolar transistor, comprising:

a semiconductor substrate of a first conductivity type having a main surface;

a memory cell formed on the main surface of said semiconductor substrate;

a bit line formed on the main surface of said semiconductor substrate and electrically connected to said memory cell;

a bipolar transistor for precharging said bit line, electrically connected to said bit line and having a collector region of a second conductivity type including an upper region having an impurity of the second conductivity type of relatively low concentration formed at the main surface of said semiconductor substrate and a lower region including the impurity of the second conductivity type at relatively high concentration, a base region of the first conductivity type formed at the upper region of said collector region by introducing an impurity of the first conductivity type entirely to the main surface of said semiconductor substrate, and an emitter region of the second conductivity type formed at the surface of said base region, impurity concentration of the second conductivity type included in said collector region immediately below said base region being at most $5 \times 10^{18}$ cm$^{-3}$; and precharge signal control means connected to said base region for controlling a precharge signal applied to said base region for precharging said bit line.

2. The semiconductor memory device having a bipolar transistor according to claim 1f wherein
said semiconductor memory device is an SRAM (Static Random Access Memory),
first and second bit lines are electrically connected to said memory cell,
first and second bipolar transistors are provided to be electrically connected to said first and second bit lines, respectively,
said base region and said collector region are shared by said first and second bipolar transistors,
first and second emitter regions of said first and second bipolar transistors are formed spaced at the surface of said base region, and
said first and second bit lines are electrically connected to said first and second emitter regions, respectively.

3. The semiconductor memory device having a bipolar transistor according to claim 1, wherein
said memory cell is formed in a first well region of the first conductivity type formed at the main surface of said semiconductor substrate,
a second well region of the second conductivity type adjacent to said first well region is formed surrounding said first well region at the main surface of said semiconductor substrate, and
a part of said second well region functions as said collector region.

4. The semiconductor memory device having a bipolar transistor according to claim 3, wherein
a buried diffusion layer of the second conductivity type is formed immediately below said first well region, to be in contact with a lower surface of said second well region and extending from below said second well region to below said first well region.

5. The semiconductor memory device having a bipolar transistor according to claim 3, wherein
said second well region is set to a power supply potential, and a potential not higher than said power supply potential is applied to said base region and to said emitter region.

6. The semiconductor memory device having a bipolar transistor according to claim 1, wherein
said collector region is formed by introducing the impurity of the second conductivity type to the main surface of said semiconductor substrate with high energy, and concentration peak of the impurity of the second conductivity type included in said collector region is positioned deeper in said semiconductor substrate than a junction between said base region and said collector region.

7. A semiconductor memory device having a bipolar transistor, comprising:
a semiconductor substrate of a first conductivity type having a main surface;
a plurality of memory cells formed on the main surface of said semiconductor substrate;
first and second bit lines formed on the main surface of said semiconductor substrate and electrically connected to a prescribed memory cell;
first and second bipolar transistors electrically connected to said first and second bit lines through first and second switching MOS transistors sharing a collector region of a second conductivity type, the collector region including an upper region having an impurity of the second conductivity type at relatively low concentration formed at the main surface of said semiconductor substrate and a lower region including the impurity of the second conductivity type at relatively high concentration, each bipolar transistor having first and second base regions of the first conductivity type formed at the upper region of said collector region by introducing an impurity of the first conductivity type entirely to the main surface of said semiconductor substrate and first and second emitter regions formed at the surfaces of said first and second base regions, impurity concentration of the second conductivity type included in said collector region immediately below said first and second base regions being $5 \times 10^{18}$ cm$^{-1}$, for shifting potential level of said first bit line and potential level of said second bit line between a first potential level and a second potential level which is lower than said first potential level; and first and second current sources connected to said first and second emitter regions, respectively, for drawing out current from emitters of said first and second bipolar transistors.

8. The semiconductor memory device having a bipolar transistor according to claim 7, wherein
said semiconductor memory device is an SRAM (Static Random Access Memory), and
potential generating means for maintaining, when one of said first and second bit lines is maintained at said first potential level, the other one at said second potential level, is connected to a node between said first switching MOS transistor and said first bipolar transistor and a node between said second switching MOS transistor and said second bipolar transistor, through an MOS transistor.

9. The semiconductor memory device having a bipolar transistor according to claim 7, wherein
said prescribed memory cell is formed in a first well region of the first conductivity type formed at the main surface of said semiconductor substrate,
a second well region of the second conductivity type is formed adjacent to said first well region, surrounding said first well region, at the main surface of said semiconductor substrate, and
a part of said second well region functions as said collector region.

10. The semiconductor memory device having a bipolar transistor according to claim 9, wherein a buried diffusion layer of the second conductivity type is formed immediately below said first well region to be in contact with a lower surface of said second well region and extending from below said second well region to below said first well region.

11. The semiconductor memory device having a bipolar transistor according to claim 9, wherein said second well region is set at a power supply potential, and a potential not higher than said power supply potential is applied to said base region and to said emitter regions.

12. The semiconductor memory device having a bipolar transistor according to claim 7, wherein said collector region is formed by introducing the impurity of the second conductivity type to the main surface of said semiconductor substrate with high energy, and concentration peak of the impurity of the second conductivity type included in said collector region is positioned deeper in said semiconductor substrate than a junction between said base regions and said collector region.

* * * * *